United States Patent
Agarwal et al.

(10) Patent No.: US 9,641,160 B2
(45) Date of Patent: May 2, 2017

(54) COMMON N-WELL STATE RETENTION FLIP-FLOP

(71) Applicant: Intel Corporation, Santa Clara, CA (US)

(72) Inventors: Amit Agarwal, Hillsboro, OR (US); Steven Hsu, Lake Oswego, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/635,849

(22) Filed: Mar. 2, 2015

(65) Prior Publication Data

US 2016/0261252 A1 Sep. 8, 2016

(51) Int. Cl.
| | |
|---|---|
| *H03K 3/356* | (2006.01) |
| *H03K 3/3562* | (2006.01) |
| *H03K 3/012* | (2006.01) |
| *H03K 3/037* | (2006.01) |

(52) U.S. Cl.
CPC ....... *H03K 3/356008* (2013.01); *H03K 3/012* (2013.01); *H03K 3/0372* (2013.01); *H03K 3/35625* (2013.01)

(58) Field of Classification Search
CPC H03K 3/012; H03K 3/12; H03K 3/53; H03K 3/289; H03K 3/3562; H03K 3/0372; H03K 3/35625; H03K 3/356008; H03K 5/04
USPC .......................... 327/198, 199, 200, 201, 202
See application file for complete search history.

(56) References Cited

U.S. PATENT DOCUMENTS

| | | | |
|---|---|---|---|
| 2002/0024049 A1* | 2/2002 | Nii | G11C 8/16 257/67 |
| 2003/0099300 A1* | 5/2003 | Anders | H04L 25/14 375/259 |
| 2006/0267654 A1* | 11/2006 | Gururajarao | H04W 52/0283 327/208 |
| 2009/0058486 A1 | 3/2009 | Ozawa et al. | |
| 2010/0102867 A1* | 4/2010 | Dhong | H03K 3/356121 327/202 |
| 2012/0249182 A1 | 10/2012 | Sherlekar | |

(Continued)

FOREIGN PATENT DOCUMENTS

JP  2008-054275 A  3/2008

OTHER PUBLICATIONS

James Myers, et al., Advanced Retention Power Gating: unlocking opportunistic leakage savings in high performance mobile SoCs, ARM Ltd, Cambridge, UK, Snug 2013, 17 pages.

(Continued)

*Primary Examiner* — John Poos
(74) *Attorney, Agent, or Firm* — Schwabe, Williamson & Wyatt, P.C.

(57) ABSTRACT

Embodiments include apparatuses, methods, and systems for state retention electronic devices. In embodiments, an electronic device may include a state retention flip-flop having a plurality of P-type metal oxide semiconductor (PMOS) devices coupled with a common N-well, with one or more of the plurality of PMOS devices powered by an always-on supply and one or more of the plurality of PMOS devices powered by a power-gated supply. Other embodiments may be described and claimed.

25 Claims, 7 Drawing Sheets

(56) References Cited

U.S. PATENT DOCUMENTS

| | | | |
|---|---|---|---|
| 2013/0088272 A1 | 4/2013 | Veggetti et al. | |
| 2014/0306735 A1 | 10/2014 | Rasouli et al. | |
| 2015/0116019 A1* | 4/2015 | Hsu .................. | H03K 3/356104 327/203 |
| 2016/0065184 A1* | 3/2016 | Liu et al. ......... | H03K 3/356121 327/225 |

OTHER PUBLICATIONS

International Search Report and Written Opinion mailed May 13, 2016, issued in corresponding International Application No. PCT/US2016/015330.

Office Action mailed Jan. 12, 2017 for Taiwanese Patent Application No. 105102716, 11 pages.

* cited by examiner

COMMON N-WELL STATE RETENTION FLIP-FLOP

GOVERNMENT INTEREST

This invention was made with Government support under contract number FA8650-13-3-7338 awarded by the Department of Defense. The Government has certain rights in this invention.

FIELD

Embodiments of the present invention relate generally to the technical field of electronic circuits, and more particularly to state retention flip-flops.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Conventional retention flip-flops use additional keeper transistors and isolated N-wells for power-gated and always-on components. This can result in an area approximately 3.5 times as large and a 30% increase in delay compared to a non-retention flip-flop.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The description and figures may refer to transistors as MPx transistor to indicate that the transistor is a p-type transistor or MNx transistor to indicate that the transistor is an n-type transistor. The type of transistor is presented as an example, and other embodiments may use other types of transistors to carry out similar functionality.

Figure 1:
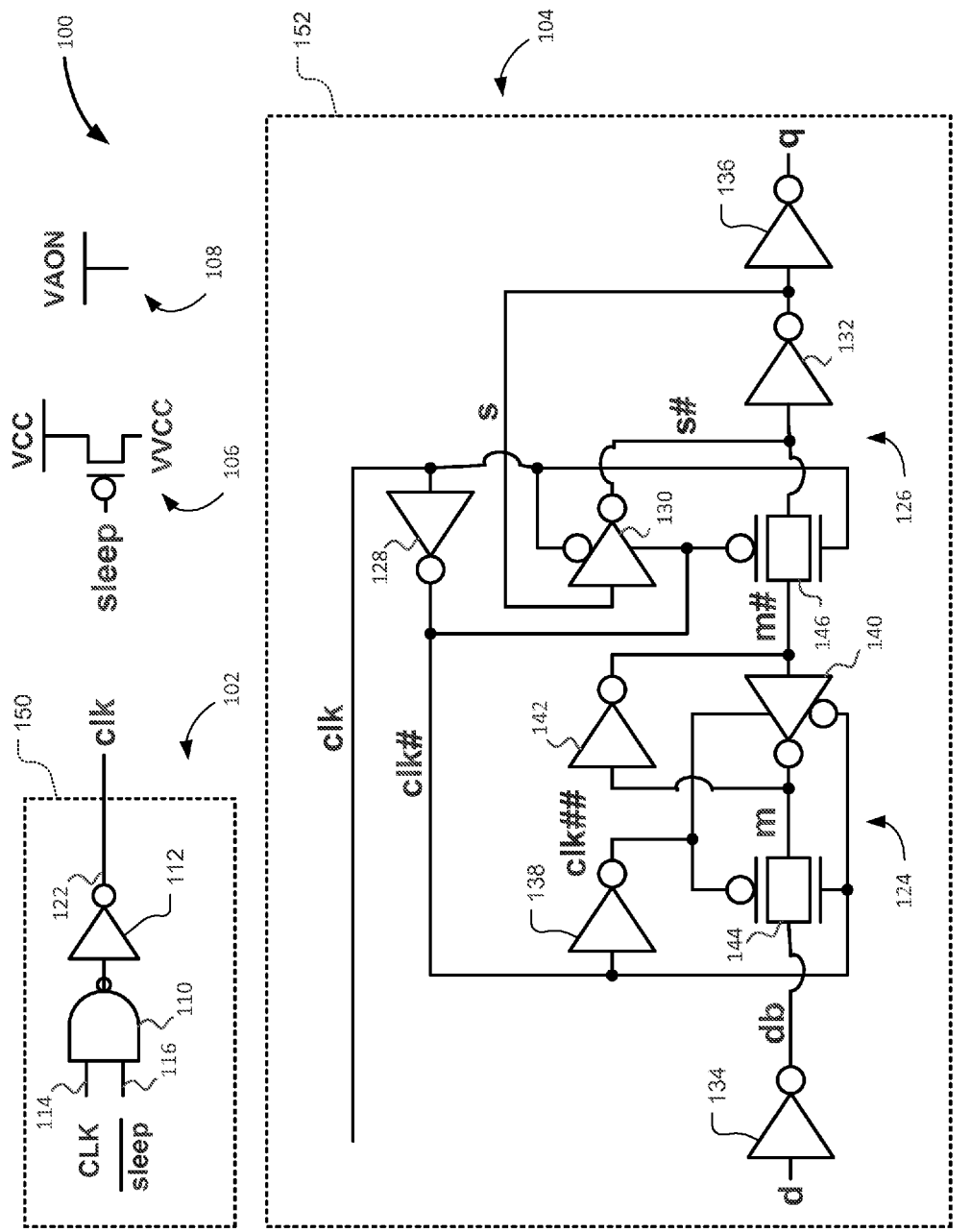
FIG. 1 illustrates a retention flip-flop circuit that includes a common N-well, in accordance with various embodiments.

FIG. 1 schematically illustrates a retention flip-flop circuit 100 (hereinafter "circuit 100") in accordance with various embodiments. In embodiments, the circuit 100 may be a circuit for an electronic device that may include a local clock buffer (LCB) 102 and a state retention flip-flop 104. A power-gated supply 106 and an always-on supply 108 may power various components in the LCB 102 and the state retention flip-flop 104. As shown, the power-gated supply 106 may receive a voltage VCC at an input terminal and may be gated by a sleep signal to selectively provide a voltage VVCC at an output terminal based on a value of the sleep signal. The always-on supply 108 may provide a voltage VAON.

In various embodiments, a plurality of transistors of the LCB 102 may be coupled with a common N-well 150 and/or a plurality of transistors of the state retention flip-flop 104 may be coupled with a common N-well 152, as further discussed below. The common N-wells 150 and 152 may be coupled with the always-on supply 108 to receive VAON. In embodiments, the use of a common N-well may provide a lower layout area compared to state retention flip-flops using isolated N-wells.

In various embodiments, the LCB 102 may include a clock forcing component that drives a clock signal CLK to a logic level of zero when a sleep signal is enabled at a logic level of one, with a corresponding sleep bar signal having a logic level of zero. In embodiments, the LCB 102 may include one or more device blocks. As shown, the LCB 102 may include a Negative AND (NAND) gate 110 and an inverter 112. The NAND gate 110 may include a first input terminal 114 to receive the clock signal CLK and a second input terminal 116 to receive an inverted sleep signal, sleep bar, that has a logic level of zero when a sleep signal is enabled with a logic level of one. In embodiments, the NAND gate 110 may be referred to as receiving a sleep state signal input that indicates a sleep state is enabled at the second input terminal 116.

In embodiments, the LCB 102 may be configured as shown, with the sleep state signal input, sleep bar, received at the second input terminal 116 which may also be referred to as a sleep signal input terminal of the LCB 102. In other embodiments, the clock forcing component of the LCB 102 may be configured in a different manner such that the sleep state signal input may be the sleep signal rather than the sleep bar signal received at an input terminal of the LCB 102.

An output terminal of the NAND gate 110 provides a NAND output signal to an input terminal of the inverter 112. The inverter 112 may include an output terminal 122 and may invert the NAND output signal to provide a local clock signal, clk, at the output terminal 122. The local clock signal, clk, may be provided one or more devices of the circuit 100. In embodiments, the local clock signal may be set to a first logic state, such as zero, when the sleep state signal indicates the sleep state is enabled, and toggle between the first logic state and a second logic state, such as one, based at least in part on the CLK input signal when the sleep state signal indicates the sleep state is not enabled.

In embodiments, the NAND gate 110 and the inverter 112 may be complementary metal-oxide semiconductor (CMOS) devices using n-type metal-oxide semiconductor (NMOS) and p-type metal-oxide semiconductor (PMOS) transistor devices. In embodiments, PMOS devices of the NAND gate 110 and the inverter 112 are coupled with a common N-well electrically coupled with VAON. The NAND gate 110 may be powered by VAON from the always-on supply 108 and the inverter 112 may be powered by VVCC from the power-gated supply 106 in various embodiments. The state retention flip-flop 104 may receive the local clock signal, clk, from the LCB 102, in various embodiments. Multiple state retention flip-flops 104 may receive the local clock signal, clk, from the same LCB 102, in embodiments.

In embodiments, the state retention flip-flop 104 may be a D-type flip-flop including a master stage 124 and a slave stage 126. As shown, the state retention flip-flop 104 may include a first clock inverter 128, a first clocked inverter 130, and an inverter 132. The inverters 128, 130, 132 may be configured as shown and powered by VAON from the always-on supply 108. In embodiments, the first clocked inverter 130 and the inverter 132 are configured as cross-coupled slave stage inverters. In embodiments, limiting VAON powered devices in the state retention flip-flop 104 to the first clock inverter 128 and the cross-coupled slave stage inverters 130, 132 may reduce current leakage during the sleep state and reduce dynamic current required from an always-on supply such as the always-on supply 108 during active mode in comparison to designs that include additional clock inverters powered by an always-on supply.

The state retention flip-flop 104 may also include a d-input inverter 134, an output inverter 136, a second clock inverter 138, a second clocked inverter 140, an inverter 142, a master transfer gate 144, and a slave transfer gate 146, that may be configured as shown and powered by VVCC from the power-gated supply 106 in various embodiments. In embodiments, the d-input inverter 134 may include an input terminal to receive an input signal 'd' and an output terminal to output an inverted d input signal, d bar ('db'). In embodiments, the output inverter 136 may include an output terminal to provide an output signal, 'q'. Master and slave stage standard and inverted states may occur as indicated, with 'm' indicating a master standard state, 'm#' indicating a master inverted state, 's' indicating a slave standard state, and 's#' indicating a slave inverted state in various embodiments. In embodiments, the inverters 128, 130, 132, 134, 136, 138, 140, 142 and the transfer gates 144, 146 may be implemented as CMOS devices using NMOS and PMOS transistor devices, with the PMOS transistor devices coupled with a common N-well that may be electrically coupled with VAON. In embodiments, a single common N-well may be used for the PMOS transistor devices of the state retention flip-flop 104, or multiple common N-wells may be used.

In embodiments, the first clock inverter 128 may include an input terminal, the first clocked inverter 130 may include a first clock input terminal, and the slave transfer gate 146 may include a first gate terminal, each of which may receive the clk signal from the LCB 102. The first clock inverter 128 may include an output terminal that provides an inverted clock signal, clk#. The first clocked inverter 130 may include a second clock input terminal, the slave transfer gate 146 may include a second gate terminal, the second clock inverter 138 may include an input terminal, the second clocked inverter 140 may include a first clock input terminal, and the master transfer gate 144 may include a first gate terminal, each of which receive the clk# signal from the first clock inverter 128. The second clock inverter 138 may include an output terminal that provides a twice inverted clock signal, clk##. The second clocked inverter 144 may include a second clock input and the master transfer gate 144 may include a second gate input, each of which receive the clk## signal from the second clock inverter 138.

In embodiments, the use of clk, clk#, and clk## to connect the master stage 124 and the slave stage 126 may provide faster clock-to-output delay and better internal minimum delay characteristics than designs using only clk# and clk## or their equivalent. In embodiments, the use of clk may partially remove delay of the first clock inverter 128 from clock-to-output delay, resulting in faster clock-to-output delay. Generally, internal minimum delay may happen at a falling edge of the clock when the slave stage 126 is closing and the master stage 124 is opening. In embodiments, use of clk, clk#, and clk## as configured in the state retention flip-flop 104 may provide improved internal minimum delay characteristics in comparison to designs using only clk# and clk## by increasing the delay between closing the slave stage 126 and opening the master stage 124 such that data does not traverse the state retention flip-flop 104 too quickly.

In embodiments, a common N-well 150 may be coupled with PMOS devices of the LCB 102 and electrically coupled to an always-on supply such as VAON from the always-on supply 108. Similarly, a common N-well 152 may be coupled with PMOS devices of the state retention flip-flop 104 and electrically coupled to an always-on supply such as VAON from the always-on supply 108. Generally, PMOS devices have an n-type body region with p-type source and drain regions. In CMOS device fabrication that uses a p-type substrate for NMOS devices, an N-well is typically diffused into the p-type substrate to create the n-type body region for the PMOS devices. N-type dopants are typically added by diffusion or ion implantation to the p-type substrate to change the substrate from p-type to n-type in the region of the well. In embodiments, the common N-well 150 may be coupled with a plurality of (e.g., all) PMOS devices of the LCB and the common N-well 152 may be coupled with a plurality of (e.g., all) PMOS devices of the state retention flip-flop 104. In embodiments, the common N-well 150 and the common N-well 152 may be continuous with each other (e.g., common N-well 150 and common N-well 152 may be considered to be part of the same common N-well). The common N-well 150 and/or the common N-well 152 may be shared with other neighboring cells in a circuit layout, including those that have devices powered by a power-gated supply. In embodiments, the use of a common N-well may provide a lower layout area compared to state retention flip-flops using isolated N-wells. For example, the layout area of the state retention flip-flop 104 may be approximately 2.7 times smaller than the layout area of state retention flip-flops that use isolated N-wells. Although shorting VAON coupled common N-wells with power-gated devices may result in some gate/junction leakage through power-gated transistors, this leakage may typically be minimal compared to overall leakage saved by power gating.

Although the state retention flip-flop 104 is shown as a D-type flip-flop, the state retention flip-flop 104 may be any type of state retention flip-flop that includes a common N-well coupled with PMOS devices in the state retention flip-flop and electrically coupled with VAON, in various embodiments. The state retention flip-flop 104 may be a reset or scan type flip-flop, for example.

Figure 2:
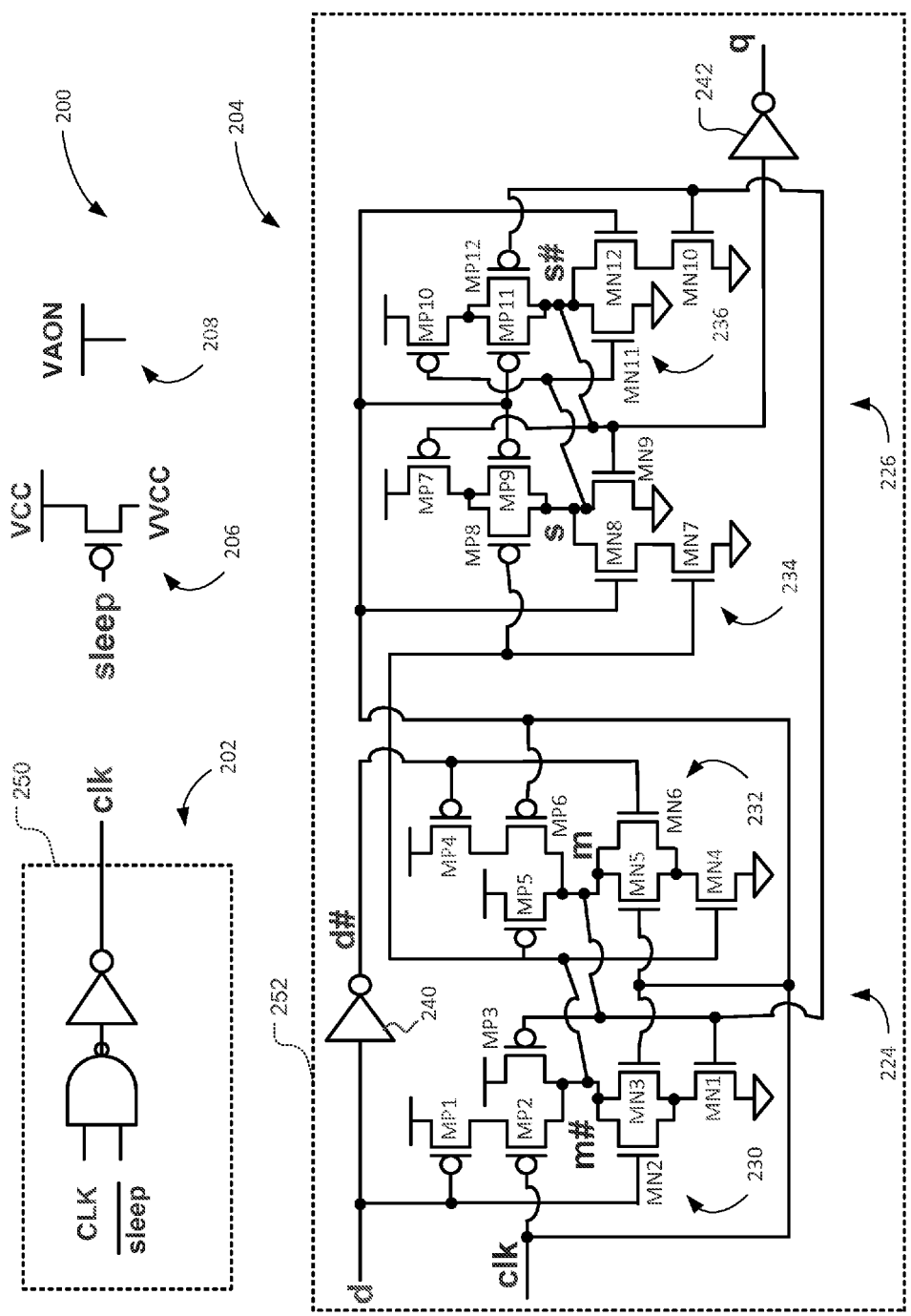
FIG. 2 illustrates a retention flip-flop circuit that includes AND-OR-Invert gates, in accordance with various embodiments.

FIG. 2 illustrates a retention flip-flop circuit 200 (hereinafter "circuit 200") that may include AND-OR-Invert gates, in accordance with various embodiments. Circuit 200 may include a LCB 202 and a state retention flip-flop 204. A power-gated supply 206 and an always-on supply 208 may power various components of the LCB 202 and the state retention flip-flop 204. The LCB 202, power-gated supply 206, and always-on supply 208 may be configured in a similar manner to the LCB 102, power-gated supply 106, and always-on supply 108, respectively, as described with respect to FIG. 1. The state retention flip-flop 204 may receive a clock signal, clk, that may be from the LCB 202, in various embodiments.

As shown, the state retention flip-flop 204 may be a D-type retention flip-flop having a master stage 224 and a slave stage 226. In embodiments, the master stage 224 may be powered by VVCC from the power-gated supply 206 and the slave stage may be powered by VAON from the always-on supply 208. As shown, the state retention flip-flop 204 may not include a clock inverter in various embodiments.

In embodiments, the master stage 224 may include a first AND-OR-Invert (AOI) gate 230 and a second AOI gate 232. In embodiments, the first AOI gate 230 and the second AOI gate 232 may be cross-coupled. The slave stage 226 may include a third AOI gate 234 and a fourth AOI gate 236, in various embodiments. In embodiments, the third AOI gate 234 and the fourth AOI gate 236 may be cross-coupled. The AOI gates 230, 232, 234, 236 may be configured as CMOS devices, with the first AOI gate 230 including transistors MP1, MP2, MP3, MN1, MN2, and MN2; the second AOI gate 232 including transistors MP4, MP5, MP6, MN4, MN5, and MN6; the third AOI gate 234 including transistors MP7, MP8, MP9, MN7, MN8, and MN9; and the fourth AOI gate 236 including transistors MP10, MP11, MP12, MN10, MN11, and MN12. In embodiments, having only transistors of the slave stage 226 powered by VAON may reduce current leakage during a sleep state and reduce dynamic current required from an always-on supply such as the always-on supply 208 during an active mode in comparison to designs that include a clock inverter powered by an always-on supply.

In embodiments, the PMOS devices of the AOI gates 230, 232, 234, 236 may be coupled with a common N-well electrically coupled with VAON. The state retention flip-flop 204 may include a first inverter 240 that receives a signal 'd' as an input to the state retention flip-flop 204 and presents an inverted d input signal, 'd#', as an output. The state retention flip-flop 204 may also include a second inverter 242 that presents a signal 'q' as an output of the state retention flip-flop 204. Master and slave stage standard and inverted states may occur as indicated with 'm', 'm#', 's', and 's#' in various embodiments.

In embodiments, a common N-well 250 may be coupled with PMOS devices of the LCB 202 and electrically coupled to an always-on supply such as VAON from the always-on supply 208. Similarly, a common N-well 252 may be coupled with PMOS devices of the state retention flip-flop 204 and electrically coupled to an always-on supply such as VAON from the always-on supply 208. In embodiments, the common N-well 250 and the common N-well 252 may be continuous with each other. The common N-well 250 and/or the common N-well 252 may be shared with other neighboring cells in a circuit layout, including those that have devices powered by a power-gated supply.

Figure 3:
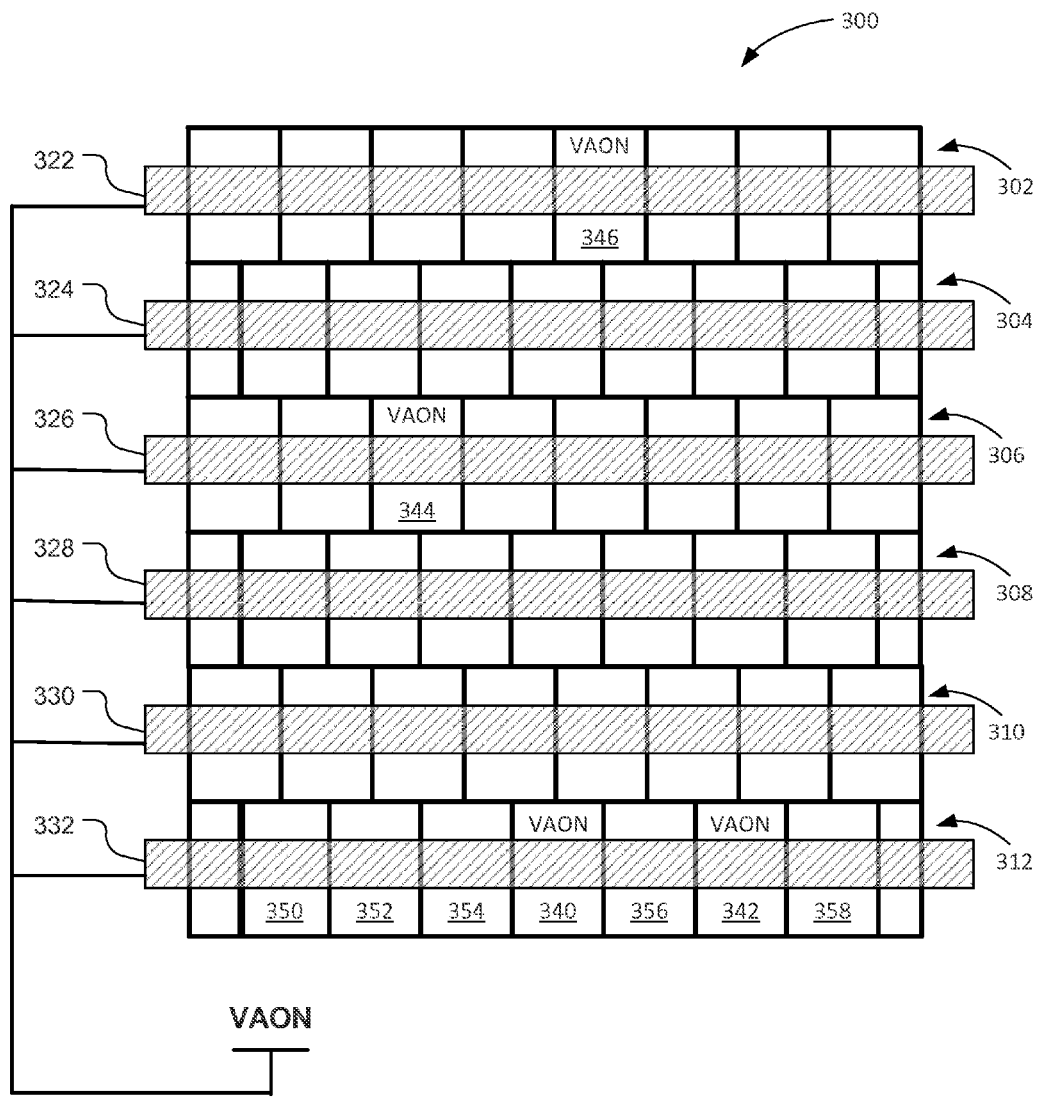
FIG. 3 illustrates a layout for an integrated circuit showing common N-wells, in accordance with various embodiments.

FIG. 3 illustrates a layout 300 for an integrated circuit that may include a common N-well in accordance with various embodiments. As shown, the layout 300 may include a plurality of rows 302, 304, 306, 308, 310, 312, each of which may include a common N-well 322, 324, 326, 328, 330, 332, respectively, that extends across the row for any PMOS devices included in the row. Each of the rows 302, 304, 306, 308, 310, 312 may include a plurality of cells. Each cell may include one or more devices powered by an always-on supply such as the always-on supply 108 or 208. Cells having a device powered by an always-on supply are labeled as VAON and include cells 340, 342, 344, and 346. VAON cells may include circuits having some devices powered by an always-on supply and other devices powered by a power-gated supply. VAON cells may include a portion or all of a flip-flop such as the state retention flip-flop 104 or 204, or a portion or all of a LCB such as the LCB 102 or 202, for example. In embodiments, one or more of common N-wells 322, 324, 326, 328, 330, or 332 may include one or more of common N-wells 150, 152, 250, or 252.

Cells not labeled with VAON may be standard cells that do not include devices powered by an always-on supply. As shown, some of the standard cells in the layout 300 include cells 350, 352, 354, 356, and 358. These cells may include devices powered by a power-gated supply such as the power-gated supply 106 or 206, for example. In embodiments, a standard cell may include a conventional, non-retention flip-flop, for example. As shown, each of the common N-wells 322, 324, 326, 328, 330, 332 may be coupled with an always-on supply such as the always-on supply 108 or 208. This may be the case even for rows such as row 308 and row 310 that do not include cells having devices powered by an always-on supply.

Figure 4:
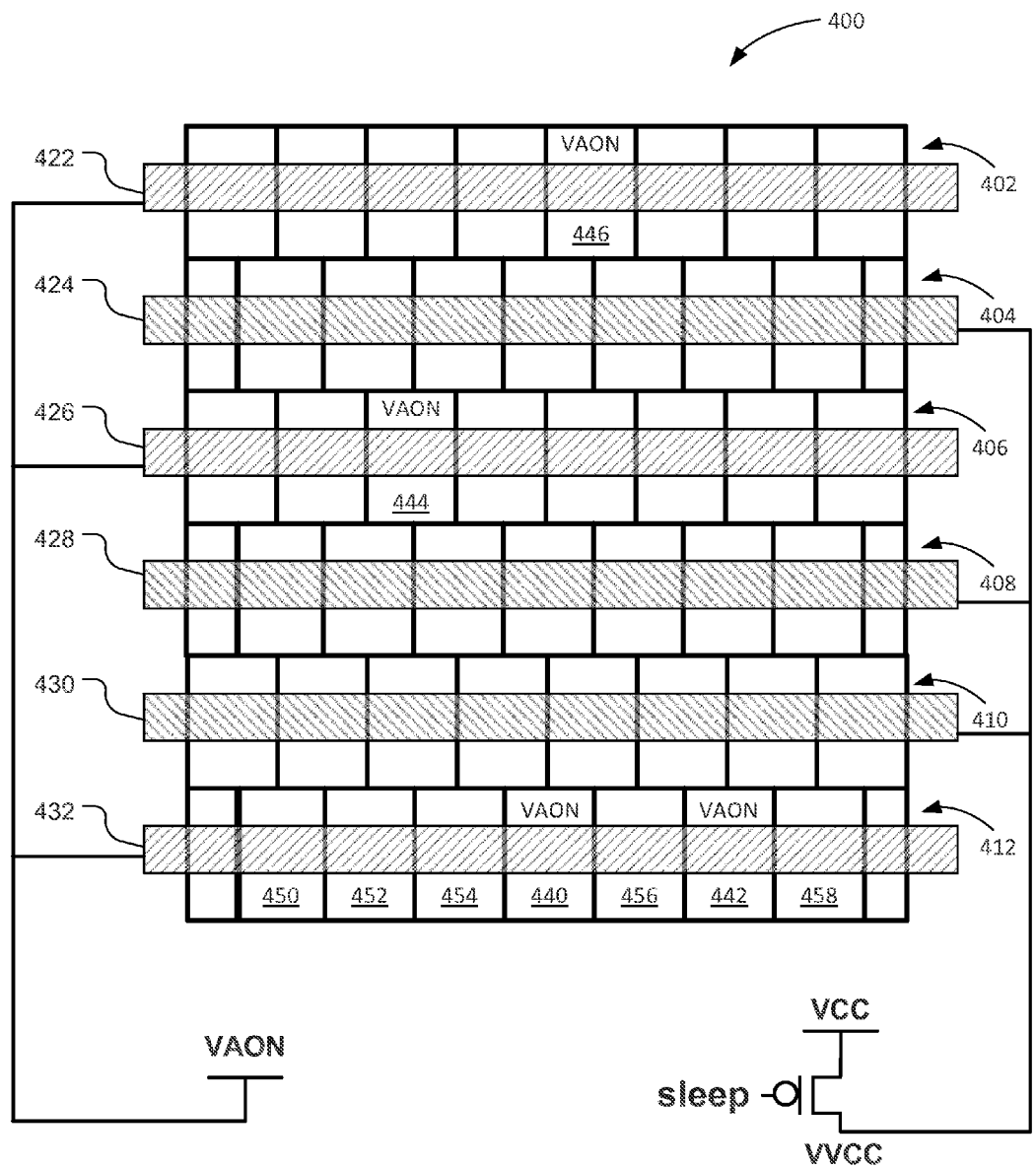
FIG. 4 illustrates a layout for an integrated circuit including selective common N-wells, in accordance with various embodiments.

FIG. 4 illustrates a layout 400 for an integrated circuit that may include selective common N-wells, in accordance with various embodiments. As shown, the layout 400 may include a plurality of rows 402, 404, 406, 408, 410, 412, each of which may include a common N-well 422, 424, 426, 428, 430, 432, respectively, that extends across the row for any PMOS devices included in the row. Each of the rows 402, 404, 406, 408, 410, 412 may include a plurality of cells. Each cell may include one or more devices powered by an always-on supply such as the always-on supply 108 or 208. Cells having a device powered by an always-on supply are labeled as VAON and include cells 440, 442, 444, and 446. VAON cells may include circuits having some devices powered by an always-on supply and other devices powered by a power-gated supply. In embodiments, all devices in a VAON cell may be powered by an always-on supply. VAON cells may include a portion or all of a flip-flop such as the state retention flip-flop 104 or 204, or a portion or all of a LCB such as the LCB 102 or 202, for example. In embodiments, one or more of common N-wells 422, 426, or 432 may include one or more of common N-wells 150, 152, 250, or 252.

Cells not labeled with VAON may be standard cells that do not include devices powered by an always-on supply and include cells 450, 452, 454, 456, and 458. As shown, only those N-wells in a row having at least one VAON cell (e.g., N-wells 422, 426, and 432) may be electrically coupled with an always-on supply such as the always-on supply 108 or 208 in various embodiments. N-wells that are associated with rows such as rows 404, 408, and 410 that do not include at least one VAON cell may not be coupled with an always-on supply, but may be electrically coupled with a power-gated supply such as the power-gated supply 106 or 206, for example. Accordingly, N-wells 424, 428, and 430 may be coupled with a power-gated supply. In embodiments, limiting the common N-wells electrically coupled with VAON to only those rows having VAON cells may reduce the junction/gate leakage overhead from the use of common N-wells electrically coupled with VAON that are coupled with power-gated PMOS devices.

Figure 5:
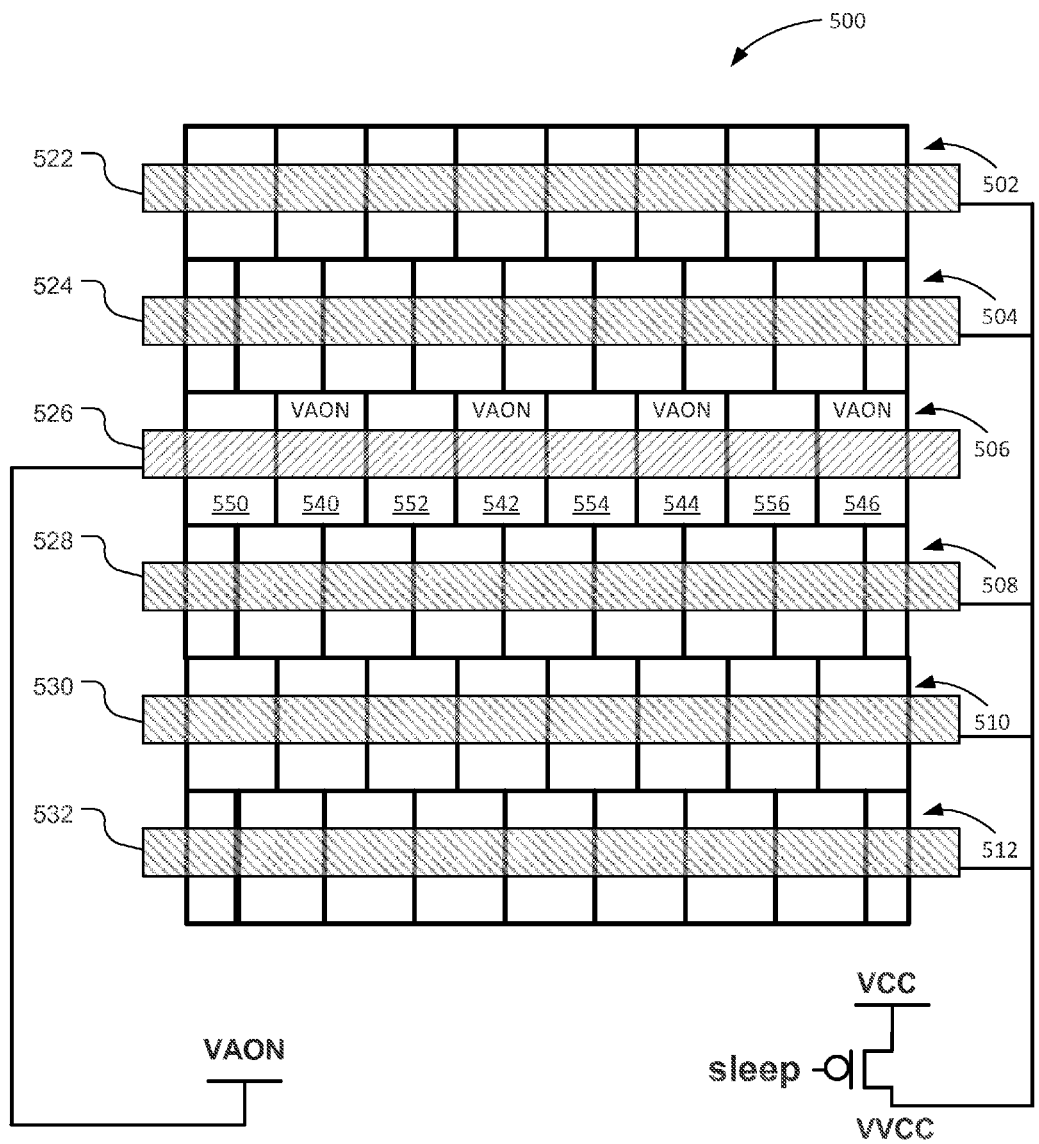
FIG. 5 illustrates a layout for an integrated circuit including partially clustered always-on cells, in accordance with various embodiments.

FIG. 5 illustrates a layout 500 for an integrated circuit that may include partially clustered always-on cells, in accordance with various embodiments. As shown, the layout 500 may include a plurality of rows 502, 504, 506, 508, 510, 512, each of which may include a common N-well 522, 524, 526, 528, 530, 532, respectively, that extends across the row for any PMOS devices included in the row. Each of the rows 502, 504, 506, 508, 510, 512 may include a plurality of cells. Each cell may include one or more devices powered by an always-on supply such as the always-on supply 108 or 208. Cells having a device powered by an always-on supply are labeled as VAON and include cells 540, 542, 544, and 546. VAON cells may include circuits having some devices powered by an always-on supply and other devices powered by a power-gated supply. VAON cells may include part or all of a flip-flop such as the state retention flip-flop 104 or 204, or part or all of a LCB such as the LCB 102 or 202, for example. In embodiments, common N-wells 526 may include one or more of common N-wells 150, 152, 250, or 252.

Cells not labeled with VAON may be standard cells that do not include devices powered by an always-on supply and include cells 550, 552, 554, and 556. One or more of the standard cells 550, 552, 554, or 556 may include a conventional non-retention flip-flop having devices powered only by a power-gated supply, for example. In embodiments, the conventional non-retention flip-flop may have a circuit configuration as shown with respect to the state-retention flip-flop 104 in FIG. 1, but having all devices powered by a power-gated supply rather than some powered by an always-on supply. As shown, the VAON cells 540, 542, 544, and 546 are partially clustered in that they are all in row 506 rather than being spread among several rows as shown with respect to the VAON cells in FIGS. 3-4. In similar fashion to the layout 400 described with respect to FIG. 4, only rows containing VAON cells (e.g., row 506) may have a common N-well coupled with an always-on supply (N-well 526). The N-well 526 may be coupled with both the VAON cells 540, 542, 544, and 546 as well as the standard cells 550, 552, 554, and 556 in various embodiments. N-wells not associated with a row having at least one VAON cell may not be coupled with an always-on supply, but may be coupled with a power-gated supply, for example. Accordingly, N-wells 522, 524, 528, 530, and 532 may be coupled with a power-gated supply such as the power-gated supply 108 or 208.

In embodiments, VAON cells may be partially clustered by limiting the number of layout rows containing VAON cells to a predefined maximum number of rows or by specifying a section of the layout in which VAON cells can be located. For example, a maximum number of VAON rows may have been predefined as one such that VAON cells 540, 542, 544, and 546 were disposed in row 506 of layout 500. Alternatively, a section of layout 500 that may contain VAON cells may have been predefined as row 506 to give layout 500. In embodiments, predefining the maximum number of VAON rows and the section that may contain VAON rows may be combined. For example, the maximum number of VAON rows may have been predefined as one and the section that may contain VAON cells may have been predefined as rows 502, 504, and 506 to give layout 500. In embodiments, a required number of VAON rows rather than a maximum number of VAON rows may be specified. For example, with respect to FIG. 4, a required number of VAON rows may have been specified as three to give the layout 400. In embodiments, more than one row of a layout may include VAON cells, with the VAON cells still being partially clustered overall. In embodiments, partially clustered VAON cells may be distributed such that for layout rows containing VAON cells, a ratio of VAON cells to standard cells summed for layout rows containing VAON cells is at least 1:2. In other embodiments, the ratio may be greater, such as at least 1:1 for example. The ratio may be calculated by summing all VAON cells to obtain a VAON cell total and summing all standard cells in rows containing VAON cells to obtain a standard cell total in rows with VAON cells, with the ratio being VAON cell total:standard cell total in rows with VAON cells, in various embodiments. In the embodiment shown, only one row includes VAON cells, with the ratio of the number of VAON cells (540, 542, 544, 546) to standard cells (550, 552, 554, 556) summed for rows containing VAON cells being 1:1. In embodiments, further limiting the common N-wells electrically coupled with VAON by partially clustering VAON cells may further reduce the junction/gate leakage overhead from the use of common N-wells electrically coupled with VAON that are coupled with power-gated PMOS devices.

Figure 6:
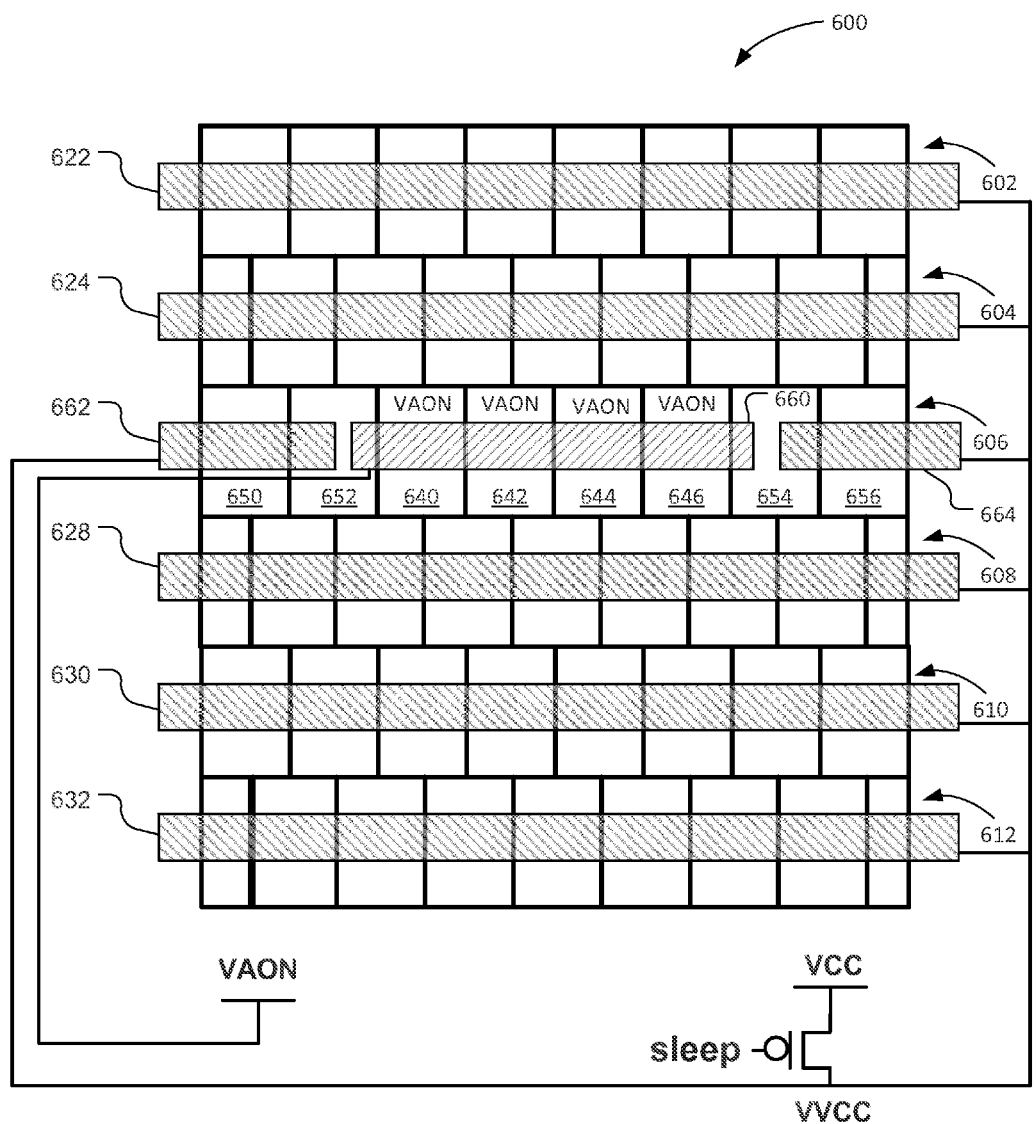
FIG. 6 illustrates a layout for an integrated circuit including clustered always-on cells, in accordance with various embodiments.

FIG. 6 illustrates a layout 600 for an integrated circuit that may include clustered always-on cells, in accordance with various embodiments. The always-on cells may be clustered in a way such that they are located adjacent to each other in the layout 600. As shown, the layout 600 may include a plurality of rows 602-612. Each of the rows 602-612 may include a plurality of cells. Each cell may include one or more devices powered by an always-on supply such as the always-on supply 108 or 208. Cells having a device powered by an always-on supply are labeled VAON. VAON cells may include circuits having some devices powered by an always-on supply and other devices powered by a power-gated supply. VAON cells may include a portion or all of a flip-flop such as the state retention flip-flop 104 or 204, or a portion or all of a LCB such as the LCB 102 or 202, for example.

Rows that do not have at least one VAON cell may include a common N-well electrically coupled with a power-gated supply in various embodiments. Accordingly, N-wells 622, 624, 628, 630, and 632 corresponding to rows 602, 604, 608, 610, and 612, respectively, may be coupled to a power-gated supply such as the power gated supply 106 or 206. Cells not labeled with VAON may be standard cells that do not include devices powered by an always-on supply. As shown, row 606 may include VAON cells 640, 642, 644, and 646 and standard cells 650, 652, 654, and 656. In embodiments, a standard cell may include a conventional, non-retention flip-flop or other circuit that does not use an always-on supply.

A common N-well 660 extends across the VAON cells 640, 642, 644, and 646 that may be electrically coupled with an always-on power supply such as the always on power supply 108 or 208. In embodiments, two or more adjacent VAON cells, such as VAON cell 640 and 620 each may include a state retention flip-flop such as the state retention flip-flop 104 or 204, each having a plurality of PMOS devices coupled with the common N-well 660. In embodiments, common N-well 660 may include one or more of common N-wells 150, 152, 250, or 252. As shown, an N-well 662 extends across standard cell 650 and partially into standard cell 652 such that a break is present between the N-well 662 and the N-well 660 in the standard cell 652. An N-well 664 extends across standard cell 656 and partially into standard cell 654 such that a break is present between the N-well 664 and the N-well 660 in the standard cell 654. The N-wells 660 and 664 may be electrically coupled with a power-gated supply such as the power-gated supply 106 or 206 in various embodiments. In embodiments, further limiting the extent of common N-wells electrically coupled with VAON by clustering VAON cells in adjacent cells and using an N-well break may further reduce the junction/gate leakage overhead from the use of common N-wells electrically coupled with VAON that are coupled with power-gated PMOS devices.

In embodiments discussed with respect to FIGS. 1-6, when common N-wells are discussed as being electrically coupled with a power-gated supply, the common N-wells may be electrically coupled with VVCC and when common N-wells are discussed as being electrically coupled with an always-on supply, the common N-wells may be electrically coupled with VAON.

Figure 7:
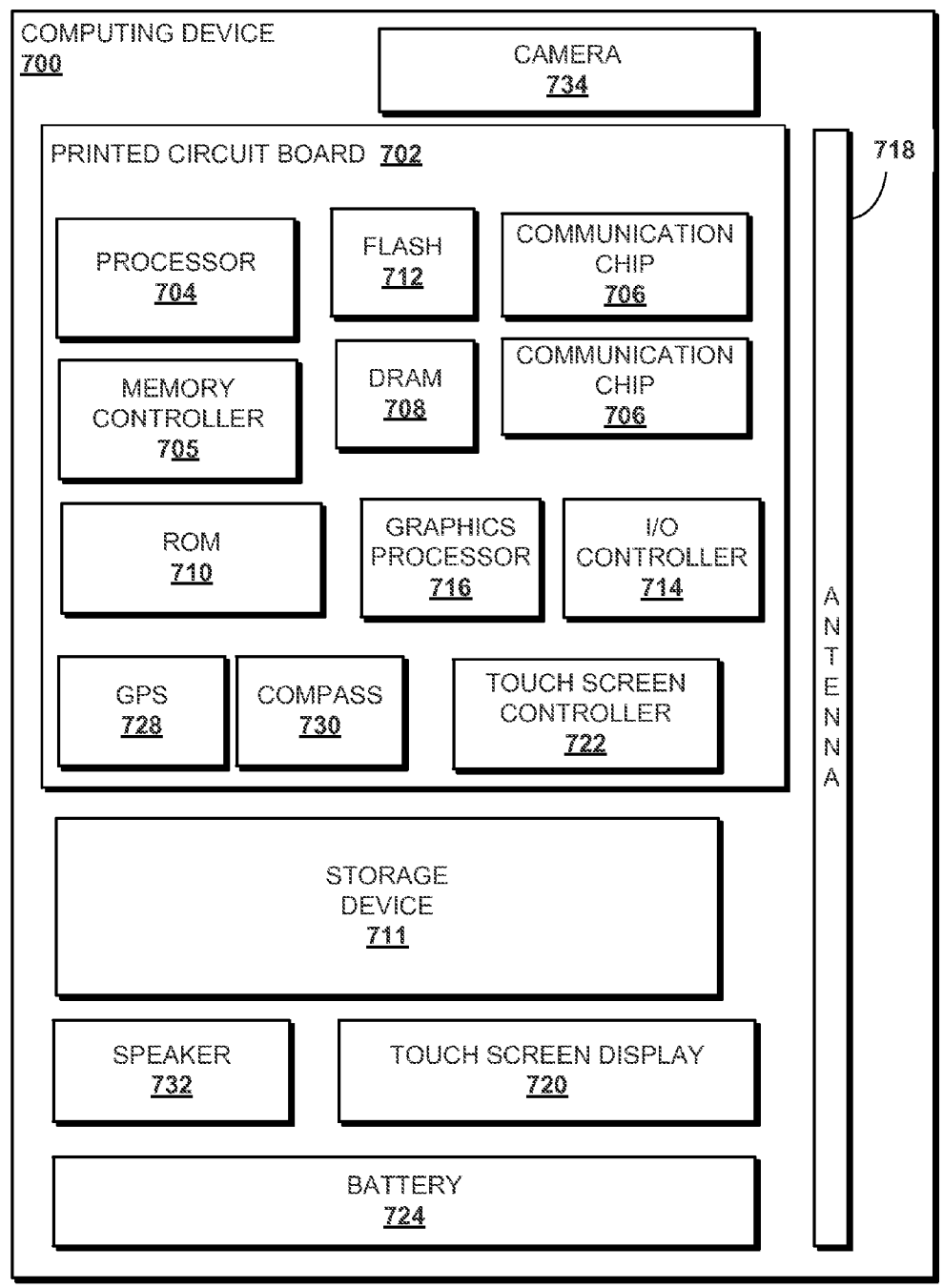
FIG. 7 illustrates an example system configured to employ the devices, circuits, and layouts described herein, in accordance with various embodiments.

FIG. 7 illustrates an example computing device 700 that may employ the devices, circuits, layouts, and/or portions thereof described herein (e.g., circuits 100 or 200; layouts 300, 400, 500, or 600; or state retention flip-flops 104 or 204), in accordance with various embodiments. As shown, computing device 700 may include a number of components, such as one or more processor(s) 704 (one shown) and at least one communication chip 706. In various embodiments, the one or more processor(s) 704 each may include one or more processor cores. In various embodiments, the at least one communication chip 706 may be physically and electrically coupled to the one or more processor(s) 704. In further implementations, the communication chip 706 may be part of the one or more processor(s) 704. In various embodiments, computing device 700 may include printed circuit board (PCB) 702. For these embodiments, the one or more processor(s) 704 and communication chip 706 may be disposed thereon. In alternate embodiments, the various components may be coupled without the employment of PCB 702.

Depending on its applications, computing device 700 may include other components that may or may not be physically and electrically coupled to the PCB 702. These other components include, but are not limited to, memory controller 705, volatile memory (e.g., dynamic random access memory (DRAM) 708), non-volatile memory such as read only memory (ROM) 710, flash memory 712, storage device 711 (e.g., a hard-disk drive (HDD)), an I/O controller 714, a digital signal processor (not shown), a crypto processor (not shown), a graphics processor 716, one or more antenna 718, a display (not shown), a touch screen display 720, a touch screen controller 722, a battery 724, an audio codec (not shown), a video codec (not shown), a global positioning system (GPS) device 728, a compass 730, an accelerometer (not shown), a gyroscope (not shown), a speaker 732, a camera 734, and a mass storage device (such as hard disk drive, a solid state drive, compact disk (CD), digital versatile disk (DVD)) (not shown), and so forth. In various embodiments, the processor 704 may be integrated on the same die with other components to form a System on Chip (SoC).

In some embodiments, the one or more processor(s) 704, flash memory 712, and/or storage device 711 may include associated firmware (not shown) storing programming instructions configured to enable computing device 700, in response to execution of the programming instructions by one or more processor(s) 704, to practice all or selected aspects of the methods described herein. In various embodiments, these aspects may additionally or alternatively be implemented using hardware separate from the one or more processor(s) 704, flash memory 712, or storage device 711.

In various embodiments, one or more components of the computing device 700 may include the circuit 100 and/or 200; the layout 300, 400, 500, and/or 600; and/or the state retention flip-flop 104 and/or 204 described herein. For example, the circuit 100 and/or 200; the layout 300, 400, 500, and/or 600; and/or the state retention flip-flop 104 and/or 204 may be included in I/O controller 714, processor 704, memory controller 705, and/or another component of computing device 700. In some embodiments, the circuit 100 and/or 200; the layout 300, 400, 500, and/or 600; and/or the state retention flip-flop 104 and/or 204 may be included in the processor 704. In embodiments, the processor 704 may include a plurality of circuits 100 and/or 200; layouts 300, 400, 500, and/or 600; and/or state retention flip-flops 104 and/or 204.

The communication chips 706 may enable wired and/or wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to IEEE 702.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth, and a second communication chip 706 may be dedicated to longer range wireless communications such as GPS, EDGE, GPRS, CDMA, WiMAX, LTE, Ev-DO, and others.

In various implementations, the computing device 700 may be a laptop, a netbook, a notebook, an ultrabook, a smartphone, a computing tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computing device 700 may be any other electronic device that processes data.

Some non-limiting Examples are presented below.

Example 1 may include an electronic device comprising: a state retention flip-flop including P-type metal oxide semiconductor (PMOS) devices coupled with a common N-well, wherein one or more of the PMOS devices coupled with the common N-well are powered by an always-on supply and one or more of the PMOS devices coupled with the common N-well are powered by a power-gated supply.

Example 2 may include the subject matter of Example 1, wherein all PMOS devices in the state retention flip-flop are coupled with the common N-well and the common N-well is electrically coupled with the always-on supply.

Example 3 may include the subject matter of Example 2, wherein the state retention flip-flop includes a slave stage having a first AND-OR-Invert (AOI) gate and a second AOI gate, wherein the first AOI gate and the second AOI gate are powered by the always-on supply.

Example 4 may include the subject matter of any one of Examples 1-2, wherein the state retention flip-flop is a first state retention flip-flop in a first cell, wherein the electronic device further includes a second state retention flip-flop in a second cell adjacent to the first cell, and wherein the second state retention flip-flop includes PMOS devices coupled with the common N-well.

Example 5 may include the subject matter of Example 4, wherein the first state retention flip-flop includes a first inverter and a second inverter, and wherein the first inverter and the second inverter are cross coupled and powered by the always-on supply.

Example 6 may include the subject matter of any one of Examples 4-5, further comprising a local clock buffer having PMOS devices coupled with the common N-well, the local clock buffer coupled with the first state retention flip-flop and the second state retention flip-flop.

Example 7 may include the subject matter of Example 6, wherein the local clock buffer includes a device block powered by the always-on supply, an input terminal to receive a sleep state signal input, and an output terminal, and wherein the local clock buffer is to output a value of logic zero when the sleep state signal input indicates a sleep state is enabled.

Example 8 may include the subject matter of any one of Examples 1-2, wherein the state retention flip-flop is a master-slave state retention flip-flop, wherein a master stage of the master-slave state retention flip-flop includes devices powered by the power-gated supply, and wherein a slave stage of the master-slave state retention flip-flop includes devices powered by the always-on supply and one or more devices powered by the power-gated supply.

Example 9 may include the subject matter of Example 8, further comprising a local clock buffer, the local clock buffer including one or more devices powered by the always-on supply and one or more devices powered by the power-gated supply, wherein the common N-well is a first common N-well, and wherein the one or more devices of the local clock buffer powered by the always-on supply include a second common N-well coupled with PMOS components of the one or more devices powered by the always-on supply.

Example 10 may include the subject matter of Example 9, wherein the second common N-well is continuous with the first common N-well.

Example 11 may include the subject matter of any one of Examples 1-10, further comprising a processor, a memory coupled with the processor, and a display coupled with the processor, wherein the processor includes the state retention flip-flop.

Example 12 may include an electronic circuit comprising: a local clock buffer having a clock forcing component with a clock input terminal to receive a clock input signal, a sleep signal input terminal to receive a sleep state signal, and an output terminal; and a state retention flip-flop having P-type metal oxide semiconductor (PMOS) devices coupled with a common N-well, wherein the local clock buffer is to provide a local clock signal to the state retention flip-flop, wherein the local clock buffer includes PMOS devices coupled with the common N-well, and wherein the local clock signal is set to a first logic state when the sleep state signal indicates a sleep state is enabled and the local clock signal toggles between the first logic state and a second logic state based at least in part on the clock input signal when the sleep state signal indicates the sleep state is not enabled.

Example 13 may include the subject matter of Example 12, wherein the state retention flip-flop includes: a first clock inverter that is to receive the local clock signal and is to output an inverted local clock signal; and a second clock inverter that is to receive the inverted local clock signal and is to output a twice inverted local clock signal.

Example 14 may include the subject matter of Example 13, wherein the first clock inverter is powered by an always-on supply and the second clock inverter is powered by a power-gated supply.

Example 15 may include the subject matter of any one of Examples 12-14, wherein the state retention flip-flop includes a master stage powered by a power-gated supply and a slave stage including a first AND-OR-Invert (AOI) gate powered by an always-on supply.

Example 16 may include the subject matter of Example 15, wherein the master stage includes master stage PMOS devices coupled with the common N-well and the slave stage includes slave stage PMOS devices coupled with the common N-well, and wherein the common N-well is coupled with the always-on supply.

Example 17 may include the subject matter of any one of Examples 15-16, wherein the slave stage includes a second AOI gate powered by the always-on supply.

Example 18 may include an integrated circuit comprising: layout rows; and a always-on voltage (VAON) cells disposed in a first layout row of the layout rows, wherein individual VAON cells of the VAON cells include one or more always-on devices, and wherein the VAON cells of the first layout row are coupled with a common N-well for P-type metal oxide semiconductor (PMOS) devices of the VAON cells.

Example 19 may include the subject matter of Example 18, wherein the common N-well is a continuous common N-well for all cells of the first layout row, and wherein the common N-well is electrically coupled with an always-on supply.

Example 20 may include the subject matter of any one of Examples 18-19 wherein the layout rows further include a standard row that does not include a VAON cell, and wherein the standard row includes an N-well electrically coupled to a power-gated supply.

Example 21 may include the subject matter of Example 20, wherein all VAON cells of the integrated circuit, including the VAON cells disposed in the first layout row, are disposed in no more than a predefined number of the layout rows.

Example 22 may include the subject matter of Example 20, wherein all VAON cells, including the VAON cells disposed in the first layout row, are disposed in a predefined section of the layout rows.

Example 23 may include the subject matter of Example 18, wherein the VAON cells in the first layout row are clustered in a block of adjoining VAON cells, wherein the common N-well extends across the block of adjoining VAON cells, and wherein the first layout row further includes one or more standard cells that are coupled with an N-well that is electrically coupled to a power-gated supply.

Example 24 may include the subject matter of any one of Examples 18-23, wherein the VAON cells include one or more state retention flip-flops, and wherein the VAON cells include a local clock buffer electrically coupled to provide a local clock signal to one or more of the one or more state retention flip-flops.

Example 25 may include the subject matter of Example 24, wherein the local clock buffer provides a local clock signal of a first logic state when a sleep state signal input to the local clock buffer indicates a sleep state is enabled.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. An electronic device comprising:
a state retention flip-flop including P-type metal oxide semiconductor (PMOS) devices coupled with a common N-well, wherein one or more of the PMOS devices coupled with the common N-well are powered by an always-on supply and one or more of the PMOS devices coupled with the common N-well are powered by a power-gated supply.

2. The electronic device of claim 1, wherein all PMOS devices in the state retention flip-flop are coupled with the common N-well and the common N-well is electrically coupled with the always-on supply.

3. The electronic device of claim 2, wherein the state retention flip-flop includes a slave stage having a first AND-OR-Invert (AOI) gate and a second AOI gate, wherein the first AOI gate and the second AOI gate are powered by the always-on supply.

4. The electronic device of claim 2, wherein the state retention flip-flop is a first state retention flip-flop in a first cell, wherein the electronic device further includes a second state retention flip-flop in a second cell adjacent to the first cell, and wherein the second state retention flip-flop includes PMOS devices coupled with the common N-well.

5. The electronic device of claim 4, wherein the first state retention flip-flop includes a first inverter and a second inverter, and wherein the first inverter and the second inverter are cross coupled and powered by the always-on supply.

6. The electronic device of claim 4, further comprising a local clock buffer having PMOS devices coupled with the common N-well, the local clock buffer coupled with the first state retention flip-flop and the second state retention flip-flop.

7. The electronic device of claim 6, wherein the local clock buffer includes a device block powered by the always-on supply, an input terminal to receive a sleep state signal input, and an output terminal, and wherein the local clock buffer is to output a value of logic zero when the sleep state signal input indicates a sleep state is enabled.

8. The electronic device of claim 1, wherein the state retention flip-flop is a master-slave state retention flip-flop, wherein a master stage of the master-slave state retention flip-flop includes devices powered by the power-gated supply, and wherein a slave stage of the master-slave state retention flip-flop includes devices powered by the always-on supply and one or more devices powered by the power-gated supply.

9. The electronic device of claim 8, further comprising a local clock buffer, the local clock buffer including one or more devices powered by the always-on supply and one or more devices powered by the power-gated supply, wherein the common N-well is a first common N-well, and wherein the one or more devices of the local clock buffer powered by the always-on supply include a second common N-well coupled with PMOS components of the one or more devices powered by the always-on supply.

10. The electronic device of claim 9, wherein the second common N-well is continuous with the first common N-well.

11. The electronic device of claim 1, further comprising a processor, a memory coupled with the processor, and a display coupled with the processor, wherein the processor includes the state retention flip-flop.

12. An electronic circuit comprising:
a local clock buffer having a clock forcing component with a clock input terminal to receive a clock input signal, a sleep signal input terminal to receive a sleep state signal, and an output terminal; and
a state retention flip-flop having P-type metal oxide semiconductor (PMOS) devices coupled with a common N-well, wherein the local clock buffer is to provide a local clock signal to the state retention flip-flop, wherein the local clock buffer includes PMOS devices coupled with the common N-well, and wherein the local clock signal is set to a first logic state when the sleep state signal indicates a sleep state is enabled and the local clock signal toggles between the first logic state and a second logic state based at least in part on the clock input signal when the sleep state signal indicates the sleep state is not enabled.

13. The electronic circuit of claim 12, wherein the state retention flip-flop includes:
- a first clock inverter that is to receive the local clock signal and is to output an inverted local clock signal; and
- a second clock inverter that is to receive the inverted local clock signal and is to output a twice inverted local clock signal.

14. The electronic circuit of claim 13, wherein the first clock inverter is powered by an always-on supply and the second clock inverter is powered by a power-gated supply.

15. The electronic circuit of claim 12, wherein the state retention flip-flop includes a master stage powered by a power-gated supply and a slave stage including a first AND-OR-Invert (AOI) gate powered by an always-on supply.

16. The electronic circuit of claim 15, wherein the master stage includes master stage PMOS devices coupled with the common N-well and the slave stage includes slave stage PMOS devices coupled with the common N-well, and wherein the common N-well is coupled with the always-on supply.

17. The electronic circuit of claim 16, wherein the slave stage includes a second AOI gate powered by the always-on supply.

18. An integrated circuit comprising:
- layout rows; and
- always-on voltage (VAON) cells disposed in a first layout row of the layout rows, wherein individual VAON cells of the VAON cells include one or more always-on devices, and wherein the VAON cells of the first layout row are coupled with a common N-well for P-type metal oxide semiconductor (PMOS) devices of the VAON cells.

19. The integrated circuit of claim 18, wherein the common N-well is a continuous common N-well for all cells of the first layout row, and wherein the common N-well is electrically coupled with an always-on supply.

20. The integrated circuit of claim 19 wherein the layout rows further include a standard row that does not include a VAON cell, and wherein the standard row includes an N-well electrically coupled to a power-gated supply.

21. The integrated circuit of claim 20, wherein all VAON cells of the integrated circuit, including VAON cells disposed in the first layout row, are disposed in no more than a predefined number of the layout rows.

22. The integrated circuit of claim 20, wherein all VAON cells, including the VAON cells disposed in the first layout row, are disposed in a predefined section of the layout rows.

23. The integrated circuit of claim 18, wherein the VAON cells in the first layout row are clustered in a block of adjoining VAON cells, wherein the common N-well extends across the block of adjoining VAON cells, and wherein the first layout row further includes one or more standard cells that are coupled with an N-well that is electrically coupled to a power-gated supply.

24. The integrated circuit of claim 18, wherein the VAON cells include one or more state retention flip-flops, and wherein the VAON cells include a local clock buffer electrically coupled to provide a local clock signal to one or more of the one or more state retention flip-flops.

25. The integrated circuit of claim 24, wherein the local clock buffer provides a local clock signal of a first logic state when a sleep state signal input to the local clock buffer indicates a sleep state is enabled.

* * * * *